(12) United States Patent
Feucht

(10) Patent No.: US 9,500,699 B2
(45) Date of Patent: Nov. 22, 2016

(54) SURGE PROTECTION CIRCUIT AND METHOD FOR TESTING A SURGE PROTECTION CIRCUIT

(75) Inventor: Thomas Feucht, Wilmsheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 632 days.

(21) Appl. No.: 14/000,948

(22) PCT Filed: Feb. 21, 2012

(86) PCT No.: PCT/EP2012/052896
§ 371 (c)(1),
(2), (4) Date: Sep. 18, 2013

(87) PCT Pub. No.: WO2012/113769
PCT Pub. Date: Aug. 30, 2012

(65) Prior Publication Data
US 2014/0002100 A1    Jan. 2, 2014

(30) Foreign Application Priority Data

Feb. 24, 2011  (DE) .......................... 10 2011 012 284

(51) Int. Cl.
*G01R 31/02*    (2006.01)
*G01R 31/08*    (2006.01)
(Continued)

(52) U.S. Cl.
CPC .......... *G01R 31/2827* (2013.01); *H02H 9/043* (2013.01); *G01R 31/12* (2013.01); *G01R 31/3277* (2013.01); *H02H 9/00* (2013.01)

(58) Field of Classification Search
CPC ................ G01R 31/2827; G01R 31/12; H02H 9/00; H02H 9/04; H02H 9/043
(Continued)

(56) References Cited

U.S. PATENT DOCUMENTS 5,751,525 A    5/1998    Olney
2002/0186518 A1    12/2002    Nishikawa et al.
(Continued)

FOREIGN PATENT DOCUMENTS

CN    1604474    4/2005
CN    1829034    9/2006
(Continued)

OTHER PUBLICATIONS

European Patent Office, International Preliminary Report on Patentability, Aug. 27, 2013, from International Patent Application No. PCT/EP2012/052896, filed on Feb. 21, 2012.
(Continued)

*Primary Examiner* — Amy He
(74) *Attorney, Agent, or Firm* — Andrews Kurth Kenyon LLP

(57) ABSTRACT

A surge protection circuit, method, computer readable medium, and use, including: at least one first electronic component having a non-linear characteristic, electrically conductively connected between a tapping point, to which a supply potential is appliable, and a node point; at least one second electronic component having a non-linear characteristic, electrically conductively connected between a tapping point, to which a ground potential is appliable, and the node point; a resistor connected between the node point and a control connection; and a monitoring unit to apply a predetermined voltage to the control connection or to output a predetermined current via the control connection and to detect a voltage/potential at the node point in response thereto, the monitoring unit being configured to identify a malfunction in the surge protection circuit when the detected voltage or the detected potential is not related to an expected voltage or expected potential in a predetermined manner.

9 Claims, 2 Drawing Sheets

(51) Int. Cl.
    *G01R 31/28*    (2006.01)
    *H02H 9/04*     (2006.01)
    H02H 9/00       (2006.01)
    G01R 31/12      (2006.01)
    G01R 31/327     (2006.01)

(58) Field of Classification Search
    USPC .................................... 324/522, 523, 537
    See application file for complete search history.

(56) References Cited

U.S. PATENT DOCUMENTS

| 2006/0198075 A1 | 9/2006 | Kato |
| 2009/0079438 A1 | 3/2009 | Nurmi et al. |
| 2009/0154039 A1 | 6/2009 | Tsugawa |
| 2012/0187969 A1* | 7/2012 | Hess ..................... H02H 9/042 324/750.3 |

FOREIGN PATENT DOCUMENTS

| DE | 10 2006 034780 | 10/2007 |
| EP | 2 071 690 | 6/2009 |

OTHER PUBLICATIONS

European Patent Office, English Translation of International Preliminary Report on Patentability, Aug. 27, 2013, from International Patent Application No. PCT/EP2012/052896, filed on Feb. 21, 2012.

* cited by examiner

SURGE PROTECTION CIRCUIT AND METHOD FOR TESTING A SURGE PROTECTION CIRCUIT

FIELD OF THE INVENTION

The present invention relates to a surge protection circuit and to a method for testing a surge protection circuit.

BACKGROUND INFORMATION

In various electronic circuits, for example a controller for a safety unit in utility vehicles, a protection circuit may be used to avoid excessively high voltages on connections of integrated circuits. In this case, it may not be possible to test whether this protection circuit is still functional over the course of time or has lost its function owing to corrosion or other environmental influences. If the protection circuit is no longer functional, this cannot be verified in the prior art and there is only assumed protection against such excessively high voltages on connections of the integrated circuit. In the event of excessively high voltages actually occurring on connections of integrated circuits, this means that the protective function of this protection circuit is no longer ensured, with the result that the integrated circuit may possibly be damaged in this case, despite the provision of the protection circuit.

SUMMARY OF THE INVENTION

An object of the present invention is to provide an improved surge protection circuit and an improved method for testing a surge protection circuit, the surge protection circuit and method providing cost-effective and checkable surge protection, for example for use in controllers.

This object may be achieved by a surge protection circuit and a method according to the main claims.

The present invention provides a surge protection circuit which has the following features:
  at least one first electronic component having a non-linear characteristic, which first electronic component is electrically conductively connected between a tapping point, to which a supply potential can be applied, and a node point;
  at least one second electronic component having a non-linear characteristic, which second electronic component is electrically conductively connected between a tapping point, to which a ground potential can be applied, and the node point;
  a resistor which is connected between the node point and a control connection; and
  a monitoring unit which is configured to apply a predetermined voltage to the control connection or to output a predetermined current via the control connection and to detect a voltage or a potential at the node point in response to this, wherein the monitoring unit (230) is configured to identify a malfunction in the surge protection circuit when the detected voltage or the detected potential is not related to an expected voltage or an expected potential in a predetermined manner.

The present invention also provides a method for testing a surge protection circuit as claimed in one of the preceding claims, wherein the method comprises the following steps:
  applying a predetermined voltage to the control connection or impressing a predetermined current into the control connection;
  detecting a voltage or a potential at the node point; and
  identifying a malfunction in the surge protection circuit when the detected voltage or the detected potential at the node point is not related to an expected voltage or an expected potential in a predetermined manner.

A computer program product having program code which can be stored in a machine-readable storage medium, such as a semiconductor memory, a hard-disk memory or an optical memory, and is used for carrying out the method according to one of the above-described embodiments when the program is executed on a signal-processing system, such as a computer or a corresponding device, is also advantageous.

The present invention is based on the knowledge that surge protection can now be realized by using two electronic components which are connected in series, in the case of which a node point between these two components is accessible for the purpose of tapping off or impressing a voltage. Firstly, a corresponding voltage or a corresponding current flow from a control connection can be impressed via this node point by a resistor, it then being possible to test the response of the first and/or second electronic component, wherein the first and second components are connected to the ground potential or to the supply potential. In this way, both the function of the first and of the second component can be monitored, for example when an expected voltages differs from an ascertained voltage at the node point (in each case based on the ground potential), when the predetermined voltage has been applied to the control connection or when the predetermined current has been impressed into the control connection.

In relation to the prior art, in the case of which only one component between a first connection, to which a supply potential can be applied, and a second connection, to which a ground potential can be applied, is tested, monitoring in the above manner now advantageously allows the individual components which make up the protection circuit for a further electronic component (for example an integrated circuit) to be tested. The use of non-linear electronic components in this case allows the protective function against excessively high voltages to be realized in an effective manner.

In this case, non-linear electronic components are, in particular, electronic components which have a non-linear characteristic of these components in a voltage/current graph. Possible components in this case include, in particular, electronic components such as diodes, zener diodes, transistors, thyristors or similar components which have a non-linear characteristic in a voltage/current graph. In this case, the monitoring unit can itself be part of the integrated circuit which is to be protected against excessively high voltages, for example a microcontroller, a digital signal processor or the like.

It is expedient when, according to one embodiment of the present invention, the first electronic component is a diode, in particular when the cathode of the diode is connected to the tapping point to which the supply potential can be applied, and the anode of the diode is connected to the node point. An embodiment of the present invention of this kind provides the advantage of a very simple configuration of the first electronic component, with the result that a cost-effective surge protection circuit can be realized.

It is particularly advantageous when the diode is a zener diode. An embodiment of the present invention of this kind provides the advantage of a simple configuration of the first electronic component, wherein the first component is not destroyed in the event of excessively high voltages actually occurring between the supply potential connection and the ground potential connection. Instead, the excessively high voltages can be discharged in a defined manner by a zener diode of this kind, wherein the breakdown voltage of the zener diode allows a large voltage drop in the voltage between the supply potential connection and the ground potential connection.

Furthermore, according to a further embodiment of the present invention, the second electronic component can be a diode. An embodiment of the present invention of this kind likewise provides the advantage of a very simple configuration of the second electronic component, with the result that a cost-effective surge protection circuit can be realized.

It is further expedient when the diode of the second electronic component is connected to the node point by way of the anode, and the cathode of the diode is connected to the tapping point to which the ground potential can be applied. An embodiment of the present invention of this kind ensures that the second electronic component ensures defined discharge of current in the event of excessively high voltages between the supply potential connection and the ground potential connection from the node point to the ground potential connection, that is to say the tapping point to which the ground potential can be applied.

In order to set a defined voltage from which the surge protection circuit discharges current by bypassing the integrated circuit which is to be protected, it is also possible to provide at least a third electronic component having a non-linear characteristic, wherein the third electronic component is electrically conductively connected between the second electronic component and the tapping point to which the ground potential can be applied, in particular wherein the third electronic component is a diode, the anode of the diode being connected to the second electronic component, and the cathode of the diode being connected to the tapping point to which the ground potential can be applied. An embodiment of the present invention of this kind provides the advantage that the voltage dropped across the second electronic component and the voltage dropped across the third electronic component can be summed by the series connection of the second electronic component and the third electronic component, with the result that a breakdown voltage which is relatively high overall can be still realized between the node point and the tapping point, to which the ground potential can be applied, in the case of small breakdown voltages of the second and of the third electronic component. This allows more precise identification of faults in the surge protection circuit than if only a small voltage between the node point and the tapping point, to which the ground potential can be applied, had to be evaluated.

As an alternative, the second electronic component used can be a diode, which is a zener diode, in particular wherein the cathode of the zener diode is connected to the node point, and the anode of the zener diode is connected to the tapping point to which the ground potential can be applied. An embodiment of the present invention of this kind provides the advantage of a higher breakdown voltage than when one or more diodes which are connected in series are used as the second electronic component. As a result, the breakdown voltage between the node point and the tapping point, to which the ground potential can be applied, can be realized with a single electronic component, as a result of which the surge protection circuit can be configured in a cost-effective and simple manner.

A further embodiment of the present invention provides for the use of a surge protection circuit according to the above description and/or of a method according to the above description in a utility vehicle, in particular for use in a safety controller, in particular for use in an ABS controller. An embodiment of the present invention of this kind ensures correct operation of the utility vehicle or functioning of a safety controller of this kind in a utility vehicle, for example a heavy-goods vehicle or a bus, over a very long period of time since the function of the first and/or second electronic component can be tested, and a fault message can optionally be output, for example at specific time intervals. In this way, a defective component can be identified in good time and replaced. As a result, a high degree of occupant protection or protection of other road users can be achieved in a cost-effective manner.

Advantageous exemplary embodiments of the present invention will be explained in greater detail below with reference to the appended drawings.

DETAILED DESCRIPTION

In the following description of the exemplary embodiments of the present invention, identical or similar reference symbols will be used for the elements which are illustrated in the various drawings and act in a similar manner, wherein these elements will not be repeatedly described.

Figure 1:
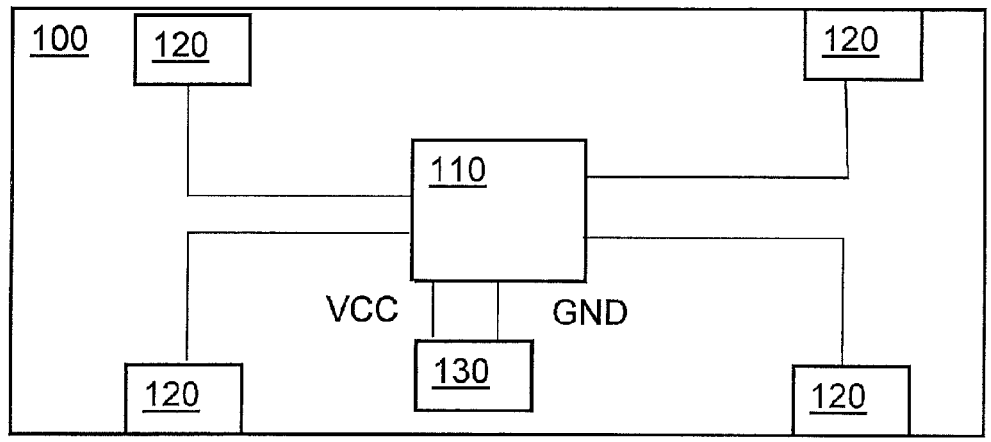
FIG. 1 shows a block diagram of a utility vehicle which has a exemplary embodiment of the surge protection circuit according to the invention.

FIG. 1 shows a block diagram of a utility vehicle which has an exemplary embodiment of the surge protection circuit according to the invention. FIG. 1 shows a utility vehicle 100, for example a heavy-goods vehicle or a bus, which has a controller 110 for the ABS function in order to supply appropriate control signals to the brake units 120 of the wheels of the utility vehicle 100. In this case, the controller 110 is supplied with electrical energy, for example, by an energy store 130 (for example a battery), wherein this electrical power is delivered between a supply potential connection VCC and a ground potential connection GND. In this case, further components (which are not illustrated in FIG. 1) are also connected to the supply potential connection VCC and the ground potential connection GND. By way of example, a charging socket for charging the energy store 130 can be provided, it being possible to make electrical contact with the two potential connections by the charging socket.

If, for example, the energy store 130 is now charged with an excessively high voltage, this excessively high voltage is also applied to the controller 110, with the result that electronic components of the controller 110 could be damaged. In order to avoid such damage, a surge protection circuit is provided in the prior art, this involving, for example, a zener diode being installed between the supply potential connection VCC and the ground potential connection GND against the direction of flow, a breakdown voltage being exceeded when an excessively high voltage is applied between the supply potential connection and the ground potential connection. In this case, current is therefore discharged in the form of a bypass around voltage-sensitive components of the controller 110, with the result that the voltage between the supply potential connection under the ground potential connection can be lowered to the maximum or desired value.

If, however, this electronic component (for example the zener diode) for ensuring the protective function is now defective, this defect cannot be detected in the prior art, with the result that, for example, the protective function is no longer active, even when the electronic component for ensuring the desired protective function is present. A defect of this kind can be caused, for example, by aging of the electronic component or in the event of an excessively high voltage actually occurring between the supply potential connection and the ground potential connection.

Figure 2:
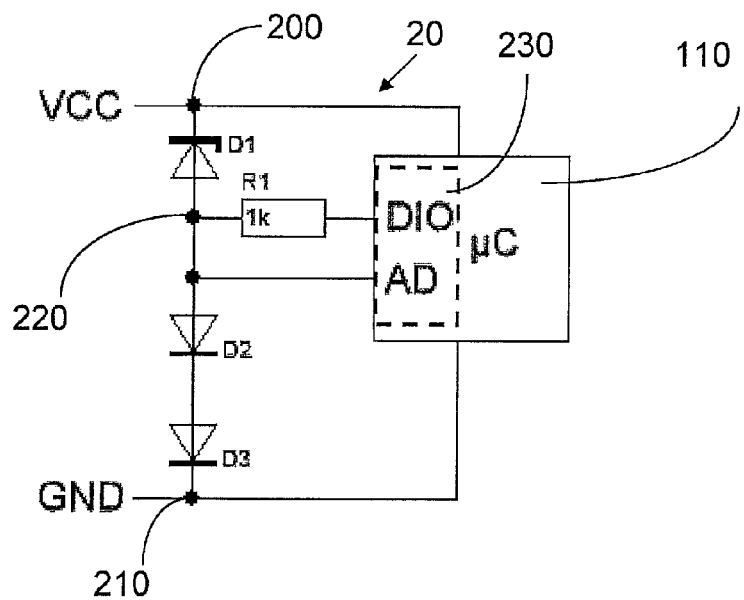
FIG. 2 shows a circuit diagram of a first exemplary embodiment of the surge protection circuit according to the invention.

In order to then identify such a case of a defect occurring in an electronic component, this ensuring the desired protective function against excessively high voltages between the connection for the supply potential VCC and the connection for the ground potential GND, a first exemplary embodiment of the present invention now proposes using two electronic components between which a node or tapping point is accessible, it being possible to apply or tap off signals at the node or tapping point. A circuit diagram of this first exemplary embodiment of the present invention is illustrated in FIG. 2. This option of tapping off signals between the two electronic components which ensure the desired protective function against excessively high voltages between the connection for the supply potential VCC and the connection for the ground potential GND now allows the two electronic components to be checked for correct functioning.

According to the circuit diagram (illustrated in FIG. 2) of the first exemplary embodiment of the surge protection circuit 20 according to the invention, a zener diode D1 and a first diode D2 and a second diode D3 are connected in series between the tapping point 200, to which the supply voltage potential VCC can be applied, and the tapping point 210, to which the ground potential GND can be applied. A node point 220 is arranged between the zener diode D1 and the first diode D2, the node point being connected to a first output DIO (DIO=Digital Input/Output) of a monitoring unit 230 via a resistor R1, wherein this first output DIO serves as the control connection for the subsequent monitoring of the surge protection circuit. In this case, the zener diode D1 is connected up in such a way that the anode of the zener diode is connected to the node point 220, while the cathode of the zener diode is connected to the tapping point 200 to which the supply potential can be applied. The anode of the first diode D2 is connected to the node point 220, whereas the cathode of the first diode D2 is connected to the anode of the second diode D3, and the cathode of the second diode D3 is connected to the tapping point 210 to which the ground potential GND can be applied. In this case, the monitoring unit 230 is likewise connected to the tapping point 200 to which the supply potential VCC can be applied, and to the tapping point 210 to which the ground potential GND can be applied, and can furthermore also contain yet further components of the controller, such as integrated circuits of a microcontroller μC, in order to implement, for example, the ABS function of the utility vehicle 100. The monitoring unit 230 can therefore be part of the microcontroller μC. Furthermore, the monitoring unit 230 is also configured to read a voltage between the node point 220 and a ground potential GND, for example via an analog input AD.

The zener diode D1 has, for example, a breakdown voltage of 3.7 or 4.2 V when a supply voltage between VCC and GND of 5 V is intended to be applied. The first diode D2 and the second diode D3 can have, for example, a flux voltage of 0.7 V when a current flows through these diodes, with the result that current begins to flow through the series circuit comprising the first and second diodes only starting from a common flux voltage of 1.4 V.

The surge protection circuit 20 according to the exemplary embodiment illustrated in FIG. 2 therefore comprises at least two diodes which are connected in series and one resistor R1 which can be switched by the monitoring unit 230 in the microcontroller μC and which, according to the circuit diagram from FIG. 2, has a value of 1 kΩ, and an analog feedback system due to the option of voltage tapping at the node point 220. If the resistor R1, which is situated between the node point 220 of the two diodes D1 and D2, the switchable resistor R1 and the analog input AC of the μC (that is to say the monitoring unit 230) on the one hand and the control connection DIO on the other, at the control input DIO is set to high (that is to say to the level of the supply potential VCC), the diode D2 or the two diodes D2 and D3, which is/are connected to GND, can be tested by analog feedback via the AD input (that is to say by reading a voltage between the node point 220 and the ground potential GND). In this case, the voltage at the node point 220 should drop to 1.4 volts due to the flux voltages of the diodes D2 and D3, with the result that, at a value which differs from this expected value for the voltage at the node point 220, a fault in the diode D2 or one of the diodes D2 or D3 can be identified. The remaining voltage up to the supply potential VCC is dropped across the resistor R1 in this case.

Similarly, the zener diode D1, which is connected to the tapping point 200 to which the supply potential VCC can be applied, can be tested by connecting the resistor R1 to GND. For example, setting the potential of the control connection DIO to the value of the ground potential GND allows the connection state of the zener diode D1 to be tested. In the case of this test, the voltage at the node point 220 should drop to a value which corresponds firstly to the difference between the voltage between the supply potential VCC and the ground potential GND and secondly the breakdown voltage of the zener diode Z1. The remaining voltage up to ground potential is dropped across the resistor R1 in this case. If the voltage value which is detected at the node point 220 differs from the expected voltage value in the above-mentioned case of testing the application of ground potential GND to the control connection, it can likewise again be concluded that there is a fault, in this case in the zener diode D1.

Figure 3:
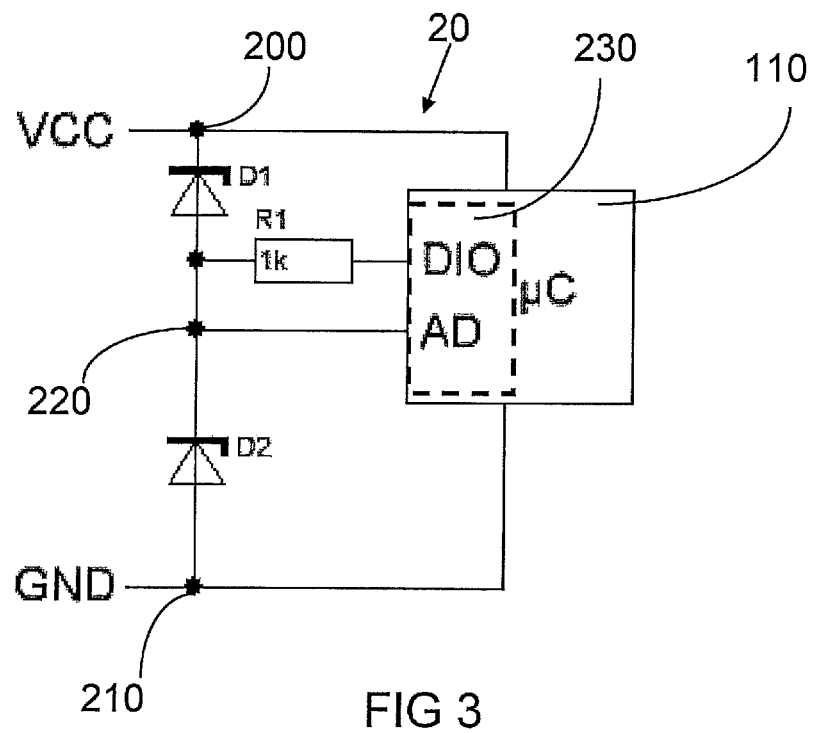
FIG. 3 shows a circuit diagram of a second exemplary embodiment of the surge protection circuit according to the invention.

FIG. 3 shows a circuit diagram of a second exemplary embodiment of the present invention of a surge protection circuit. In this case, the circuit topology of the surge protection circuit 20 corresponds to the circuit topology from FIG. 2 of the surge protection circuit 20, with the difference that, instead of the first diode D2 and/or the second diode D3 as the second component, a further zener diode D2 is used as the second component. The polarity of this further zener diode D2 is such that the anode of the zener diode is connected to the tapping point 210 to which the ground potential GND can be applied, and the anode of the zener diode is connected to the to the node point 220. An exemplary embodiment of the present invention of this kind provides the advantage over the circuit topology illustrated in FIG. 2 that only one component has to be used, and at the same time a sufficiently high breakdown voltage can be achieved, this leading to a sufficiently high voltage, which can be tapped off, at the node point 220, with the result that faults can be reliably identified in the first and/or second electronic component.

As an alternative, it is also possible to set the first electronic component in the form of the zener diode D1 by a series circuit of two diodes, wherein the two diodes would be connected in accordance with the polarity from FIG. 2, that is to say against the polarity of the zener diode D1 from FIGS. 2 and 3.

Figure 4:
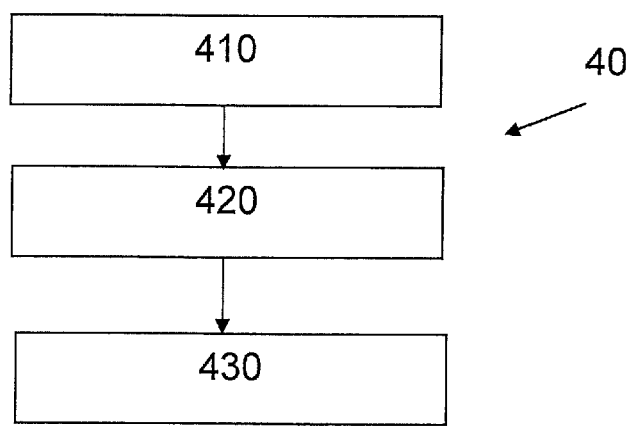
FIG. 4 shows a flowchart of an exemplary embodiment of the method according to the invention.

FIG. 4 shows a flowchart of an exemplary embodiment of the present invention as a method 40 for testing a surge protection circuit 20. The method uses a surge protection circuit, as has been described above. The method 40 comprises a step of applying 410 a predetermined voltage to the control connection or impressing a predetermined current into the control connection. The method further comprises a step of detecting 420 a voltage at the node point, and a step of identifying 430 a malfunction in the surge protection circuit when the detected voltage between the node point and the ground potential is not related to an expected voltage at the node point in a predetermined manner.

The background to the present invention is therefore that, for example, overvoltage protection by a zener diode cannot be tested for freedom from faults over the service life of controllers. An important aspect of the present invention was therefore that of removing the inability to monitor the surge protection, as a result of which the controllers with an untestable surge protection of this kind cannot actually be used for increasing the safety requirements in a utility vehicle.

According to the solution proposed here, the surge protection circuit can now be part of an internal computer supply voltage unit. The structural configuration of the surge protection circuit comprises standard components. By virtue of the approach proposed here, surge protection during operation can be tested for existence or efficacy. At the same time, only low hardware costs have to be taken into account for implementing the approach presented here.

The described exemplary embodiments are selected only by way of example and can be combined with one another.

The list of reference symbols is as follows:
100 Utility vehicle
110 Controller
120 Brake unit
130 Energy store, battery
20 Surge protection circuit
200 Tapping point to which the supply potential can be applied
210 Tapping point to which the ground potential can be applied
220 Node point
230 Monitoring unit
D1 Zener diode
D2 First diode, zener diode
D3 Second diode
R1 Resistor
DIO Control connection
AD Analog input
40 Method for monitoring a surge protection circuit
410 Application step
420 Detection step
430 Identification step

The invention claimed is:

1. A surge protection circuit, comprising:
at least one first electronic component having a non-linear characteristic, and which is electrically conductively connected between a tapping point, to which a supply potential is appliable, and a node point, wherein the first electronic component includes a diode, a cathode of the diode being connected to the tapping point to which the supply potential is appliable, and an anode of the diode being connected to the node point;
at least one second electronic component having a non-linear characteristic, and which is electrically conductively connected between a tapping point, to which a ground potential is appliable, and the node point;
a resistor connected between the node point and a control connection; and
a monitoring unit to apply a predetermined voltage to the control connection or to output a predetermined current via the control connection and to detect a voltage or a potential at the node point in response to this, wherein the control connection is an output of the monitoring unit, and wherein the monitoring unit is configured to identify a malfunction in the surge protection circuit when the detected voltage or the detected potential is not related to an expected voltage or an expected potential in a predetermined manner.

2. The surge protection circuit of claim 1, wherein the diode of the first electronic component includes a zener diode.

3. The surge protection circuit of claim 1, wherein the second electronic component includes a diode.

4. The surge protection circuit of claim 3, wherein an anode of the diode of the second electronic component is connected to the node point, and a cathode of the diode of the second electronic component being connected to the tapping point to which the ground potential is appliable.

5. The surge protection circuit of claim 4, further comprising:
at least a third electronic component having a non-linear characteristic, wherein the third electronic component is electrically conductively connected between the second electronic component and the tapping point to which the ground potential is appliable, wherein the third electronic component includes a diode, an anode of the diode being connected to the second electronic component, and a cathode of the diode being connected to the tapping point to which the ground potential is appliable.

6. The surge protection circuit of claim 3, wherein the second electronic component includes a zener diode, wherein a cathode of the zener diode is connected to the node point, and an anode of the zener diode is connected to the tapping point to which the ground potential is appliable.

7. A method for testing a surge protection circuit, the method comprising:
applying a predetermined voltage to a control connection of the surge protection circuit or impressing a predetermined current into the control connection, wherein the surge protection circuit includes at least one first electronic component having a non-linear characteristic, and which is electrically conductively connected between a tapping point, to which a supply potential is appliable, and a node point, wherein the first electronic component includes a diode, a cathode of the diode being connected to the tapping point to which the supply potential is appliable, and an anode of the diode being connected to the node point, and wherein the surge protection circuit further includes at least one second electronic component having a non-linear characteristic, and which is electrically conductively connected between a tapping point, to which a ground potential is appliable, and the node point, a resistor connected between the node point and the control connection, and a monitoring unit to apply a predetermined voltage to the control connection or to output a predetermined current via the control connection and to detect a voltage or a potential at the node point in response thereto, wherein the control connection is an output of the monitoring unit;

detecting a voltage or a potential at the node point; and identifying a malfunction in the surge protection circuit when the detected voltage or the detected potential is not related to an expected voltage or an expected potential in a predetermined manner.

8. A non-transitory computer readable medium having a computer program, which is executable by a processor, comprising:

a program code arrangement having program code for testing a surge protection circuit, by performing the following:

applying a predetermined voltage to a control connection of the surge protection circuit or impressing a predetermined current into the control connection, wherein the surge protection circuit includes at least one first electronic component having a non-linear characteristic, and which is electrically conductively connected between a tapping point, to which a supply potential is appliable, and a node point, wherein the first electronic component includes a diode, a cathode of the diode being connected to the tapping point to which the supply potential is appliable, and an anode of the diode being connected to the node point, and wherein the surge protection circuit further includes at least one second electronic component having a non-linear characteristic, and which is electrically conductively connected between a tapping point, to which a ground potential is appliable, and the node point, a resistor connected between the node point and the control connection, and a monitoring unit to apply a predetermined voltage to the control connection or to output a predetermined current via the control connection and to detect a voltage or a potential at the node point in response thereto, wherein the control connection is an output of the monitoring unit;

detecting a voltage or a potential at the node point; and identifying a malfunction in the surge protection circuit when the detected voltage or the detected potential is not related to an expected voltage or an expected potential in a predetermined manner.

9. An ABS controller for a utility vehicle, comprising:

a surge protection circuit, including:

at least one first electronic component having a non-linear characteristic, and which is electrically conductively connected between a tapping point, to which a supply potential is appliable, and a node point, wherein the first electronic component includes a diode, a cathode of the diode being connected to the tapping point to which the supply potential is appliable, and an anode of the diode being connected to the node point;

at least one second electronic component having a non-linear characteristic, and which is electrically conductively connected between a tapping point, to which a ground potential is appliable, and the node point;

a resistor connected between the node point and a control connection; and a monitoring unit to apply a predetermined voltage to the control connection or to output a predetermined current via the control connection and to detect a voltage or a potential at the node point in response to this, wherein the control connection is an output of the monitoring unit, and wherein the monitoring unit is configured to identify a malfunction in the surge protection circuit when the detected voltage or the detected potential is not related to an expected voltage or an expected potential in a predetermined manner.

* * * * *